(12) United States Patent
Tsai

(10) Patent No.: US 9,219,367 B2
(45) Date of Patent: Dec. 22, 2015

(54) METHOD AND APPARATUS FOR CONTROLLING A POWER SUPPLY DEVICE WITH AID OF FULL-FEATURED MODULARIZED FUNCTIONAL BLOCKS

(71) Applicant: Fu-Sheng Tsai, Taoyuan County (TW)

(72) Inventor: Fu-Sheng Tsai, Taoyuan County (TW)

(73) Assignee: Fu-Sheng Tsai, Taoyuan Dist., Taoyuan (TW)

( * ) Notice: Subject to any disclaimer, the term of this patent is extended or adjusted under 35 U.S.C. 154(b) by 170 days.

(21) Appl. No.: 14/191,449

(22) Filed: Feb. 27, 2014

(65) Prior Publication Data

US 2014/0239898 A1    Aug. 28, 2014

Related U.S. Application Data

(60) Provisional application No. 61/769,754, filed on Feb. 27, 2013.

(51) Int. Cl.
*H02J 7/00* (2006.01)
*H03K 5/04* (2006.01)

(52) U.S. Cl.
CPC .............. *H02J 7/0014* (2013.01); *H02J 7/007* (2013.01); *H03K 5/04* (2013.01); *Y10T 307/747* (2015.04)

(58) Field of Classification Search
CPC .. H02J 7/0016; H02J 7/0018; Y02T 10/7055; Y02E 60/12; H01M 10/441
USPC ....................................................... 320/118
See application file for complete search history.

(56) References Cited

U.S. PATENT DOCUMENTS

| | | | | |
|---|---|---|---|---|
| 5,498,950 A | * | 3/1996 | Ouwerkerk | B60L 11/1861 320/119 |
| 8,299,755 B2 | * | 10/2012 | Shiu | H02J 7/0018 320/116 |
| 8,547,064 B2 | * | 10/2013 | Cooper | H02J 7/0021 320/112 |
| 2006/0192532 A1 | * | 8/2006 | Oba | H03M 1/002 320/128 |
| 2009/0315516 A1 | * | 12/2009 | Choi | B60R 16/03 320/116 |
| 2012/0062187 A1 | * | 3/2012 | Shim | H02J 7/0016 320/167 |

* cited by examiner

*Primary Examiner* — Arun Williams
(74) *Attorney, Agent, or Firm* — Winston Hsu; Scott Margo

(57) ABSTRACT

A method and apparatus for controlling a power supply device is provided, where the apparatus includes at least one portion of the power supply device. The apparatus includes at least one battery module, each of which is a battery module of a set of battery modules connected in series within the power supply device, where each battery module of the set of battery modules includes at least one battery cell, at least one processing circuit, and at least one balancing circuit, which is electrically connected to the battery cell and the processing circuit. The processing circuit controls operations of the aforementioned each battery module of the set of battery modules. In addition, under control of the processing circuit, the balancing circuit performs balancing of the battery cell. Additionally, the balancing circuit provides the processing circuit with a bias voltage, and the processing circuit obtains electric power from the balancing circuit.

20 Claims, 10 Drawing Sheets

METHOD AND APPARATUS FOR CONTROLLING A POWER SUPPLY DEVICE WITH AID OF FULL-FEATURED MODULARIZED FUNCTIONAL BLOCKS

CROSS REFERENCE TO RELATED APPLICATIONS

This application claims the benefit of U.S. Provisional Application No. 61/769,754, which was filed on Feb. 27, 2013, and is included herein by reference.

BACKGROUND OF THE INVENTION

1. Field of the Invention

The present invention relates to a power supply device, and more particularly, to a method for controlling a power supply device, and to an associated apparatus.

2. Description of the Prior Art

A conventional power supply device (e.g. a redundant power supply) usually includes a special purpose control circuit disposed therein in order to control operations of batteries within the conventional power supply device. In accordance with the related art, as the control circuit within the conventional power supply device requires a special design, certain problems may occur. For example, when output specifications of the conventional power supply device vary, the control circuit needs to be modified accordingly, resulting in an increase of related costs. In another example, as the design of the control circuit is updated in response to user requirements, mechanical elements within the conventional power supply device (e.g. cases) need to be modified accordingly, resulting in an increase of related costs. Thus, a novel method is needed to enhance the control of the power supply device without introducing undesirable side effects and improve the basic architecture of the power supply device.

SUMMARY OF THE INVENTION

It is therefore an objective of the present invention to provide a method for controlling a power supply device, and to provide an associated apparatus, in order to solve the above-mentioned problems.

It is another objective of the present invention to provide a method for controlling a power supply device, and to provide an associated apparatus, in order to implement a configurable battery system and achieve the goal of easy system configuration.

According to at least one preferred embodiment of the present invention, an apparatus for controlling a power supply device is provided, where the apparatus comprises at least one portion of the power supply device. More particularly, the apparatus comprises at least one battery module, each of which is a battery module of a set of battery modules connected in series within the power supply device, wherein each battery module of the set of battery modules comprises at least one battery cell, a processing circuit, and a balancing circuit, which is electrically connected to the aforementioned at least one battery cell and the processing circuit. The processing circuit is arranged to control operations of the aforementioned each battery module of the set of battery modules. In addition, under control of the processing circuit, the balancing circuit performs balancing of the aforementioned at least one battery cell. Additionally, the balancing circuit provides the processing circuit with a bias voltage, and the processing circuit obtains electric power from the balancing circuit.

According to at least one preferred embodiment of the present invention, a method for controlling a power supply device is provided. The method comprises: utilizing a balancing circuit of a specific battery module of a set of battery modules connected in series within the power supply device to perform balancing of at least one battery cell of the specific battery module; and utilizing the at least one balancing circuit to provide a processing circuit of the specific battery module with a bias voltage, wherein the at least one processing circuit obtains electric power from the at least one balancing circuit, and is arranged to control operations of the specific battery module.

It is an advantage of the present invention that the method and apparatus for controlling a power supply device may realize automatic balancing between multiple battery modules without introducing undesirable side effects. In addition, the proposed method and apparatus are not limited by the number of the battery modules, and may realize self-balancing of a power supply device having multiple battery modules. Thus, a power supply device implemented according to the proposed method and apparatus may provide very high output voltages, and the problem of a severely shortened life in a weaker battery module will not occur. The proposed method and apparatus are beneficial for manufacturing, testing, installation, usage, servicing (e.g. replacing failed battery module(s)) and/or flexibility promotion (e.g. changing output specifications by adding or removing at least one battery module) of the power supply device. Additionally, based on the proposed method and apparatus, a power supply device can be implemented and configured with ease. As each of the functional blocks (e.g. any of the battery modules, the power module, or the integrated module) is a full-featured modularized functional block, the goal of easy system configuration can be achieved, where related costs can be saved. As the block balancing function and bias circuits are built-in in the modules, there is no need to redesign the functional blocks when the power supply device is configured to be different systems (e.g. the number of battery modules is changed) for different requirements, respectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
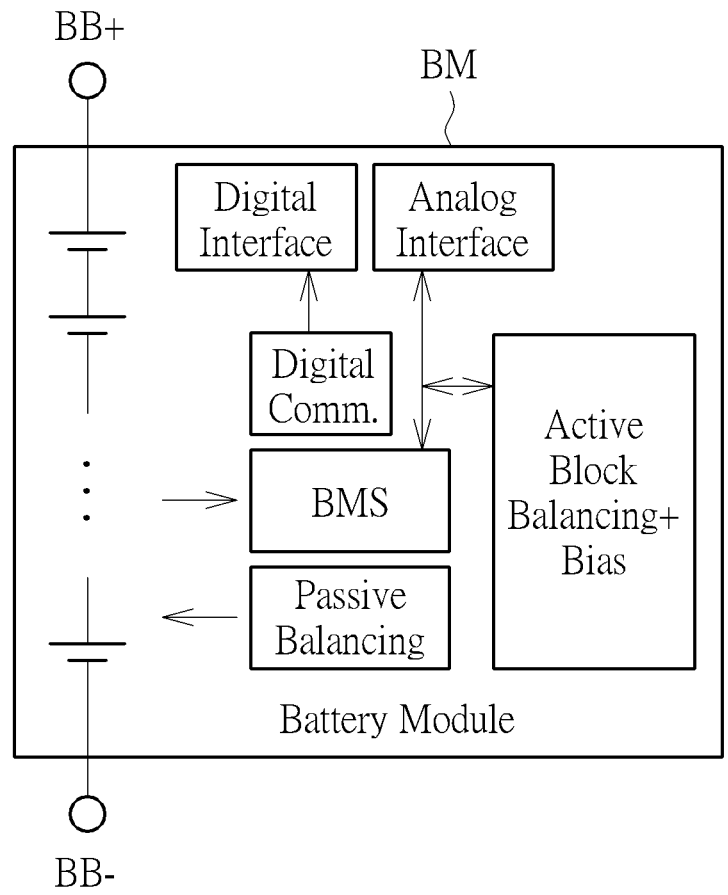
FIG. 1 is a diagram of an apparatus for controlling a power supply device according to a first embodiment of the present invention, where the apparatus of this embodiment comprises a battery module.

FIG. 1 is a diagram of an apparatus for controlling a power supply device according to a first embodiment of the present invention, where the apparatus of this embodiment comprises a battery module BM, which can be a portion of the power supply device, and the battery module BM can also be referred to as the battery block (BB). The battery module BM may comprise at least one battery cell (e.g. one or more battery cells) such as the battery cells shown in the left half of FIG. 1, and may comprise at least one processing circuit arranged to control operations of the battery module BM, and may further comprise at least one balancing circuit electrically connected to the aforementioned at least one battery cell and the aforementioned at least one processing circuit, where under control of the aforementioned at least one processing circuit, the aforementioned at least one balancing circuit performs balancing of the aforementioned at least one battery cell of the battery module BM. For example, the aforementioned at least one balancing circuit may comprise a passive balancing circuit (labeled "Passive Balancing" in FIG. 1, for brevity), and may further comprise an active balancing circuit such as an active block balancing and bias circuit (labeled "Active Block Balancing+Bias" in FIG. 1, for brevity), and the aforementioned at least one processing circuit may comprise a digital communication control circuit (labeled "Digital Comm." in FIG. 1, for brevity) and a block management service (BMS) circuit (labeled "BMS" in FIG. 1, for brevity). In addition, the battery module BM may comprise a digital interface and an analog interface, which are arranged to communicate with one or more other modules within the power supply device for the battery module BM by using digital signals and analog signals, respectively.

According to this embodiment, the passive balancing circuit is arranged to perform passive balancing of the battery cells for the battery module BM. For example, under control of the BMS circuit, the passive balancing circuit may perform passive balancing between the battery cells of the battery module BM, and more particularly, to dynamically remove energy from a specific battery cell of the battery cells of the battery module BM in a situation where the voltage drop of the specific battery cell is higher than that of others within the battery cells of the battery module BM. This is for illustrative purposes only, and is not meant to be a limitation of the present invention. According to some variations of this embodiment, the passive balancing circuit may perform passive balancing on the battery cells of the battery module BM, and more particularly, to dynamically remove energy from the battery cells of the battery module BM in a situation where the total voltage drop of the battery cells of the battery module BM is higher than that of at least one other module (e.g. the total voltage drop of the battery cells of another battery module, or the total voltage drop of the battery cells within a certain module that is not referred to as "battery module") within the power supply device.

In addition, according to this embodiment, the active balancing circuit such as the active block balancing and bias circuit is arranged to perform active balancing of the battery cells for the battery module BM. For example, under control of a system control circuit of the power supply device, the active balancing circuit such as the active block balancing and bias circuit may perform active balancing between the battery cells of the battery module BM and that of at least one other module (e.g. another battery module, or a certain module that is not referred to as "battery module") within the power supply device, and more particularly, to dynamically collect energy from the battery module BM (more particularly, the battery cells of the battery module BM) in order to redistribute energy toward the aforementioned at least one other module or collect energy from the aforementioned at least one other module in order to redistribute energy toward the battery module BM (more particularly, the battery cells of the battery module BM). This is for illustrative purposes only, and is not meant to be a limitation of the present invention. According to some variations of this embodiment, the active balancing circuit such as the active block balancing and bias circuit may perform active balancing between the battery cells of the battery module BM. More particularly, in this embodiment, the active block balancing and bias circuit is further arranged to provide the aforementioned at least one processing circuit of the battery module BM with a bias voltage, where the aforementioned at least one processing circuit of the battery module BM may obtain electric power from the active block balancing and bias circuit.

Additionally, the aforementioned at least one processing circuit is arranged to control operations of the battery module BM. For example, the digital communication control circuit may perform digital communication control for the battery module BM (more particularly, for the BMS circuit of the battery module BM). In another example, the BMS circuit may detect voltage levels at terminals of each of the battery cells of battery module BM, and selectively enable or disable at least one portion (e.g. a portion or all) of the aforementioned at least one balancing circuit, such as at least one portion (e.g. a portion or all) of the passive balancing circuit and/or at least one portion (e.g. a portion or all) of the active balancing circuit mentioned above, based on the detection results of the voltage level detection (e.g. the voltage levels at the terminals of the battery cells of battery module BM).

In practice, the battery module BM may comprise a case arranged to protect components (e.g. the battery cells and the internal circuits) of the battery module BM. For example, the external terminals BB+ and BB− of the battery cells can be positioned on the case of the battery module BM, and can be implemented with one or more connectors installed on the case of the battery module BM. This is for illustrative purposes only, and is not meant to be a limitation of the present invention. In another example, the external terminals BB+ and BB− of the battery cells can be implemented with one or more connectors and one or more cables extended from the case of the battery module BM.

Figure 2:
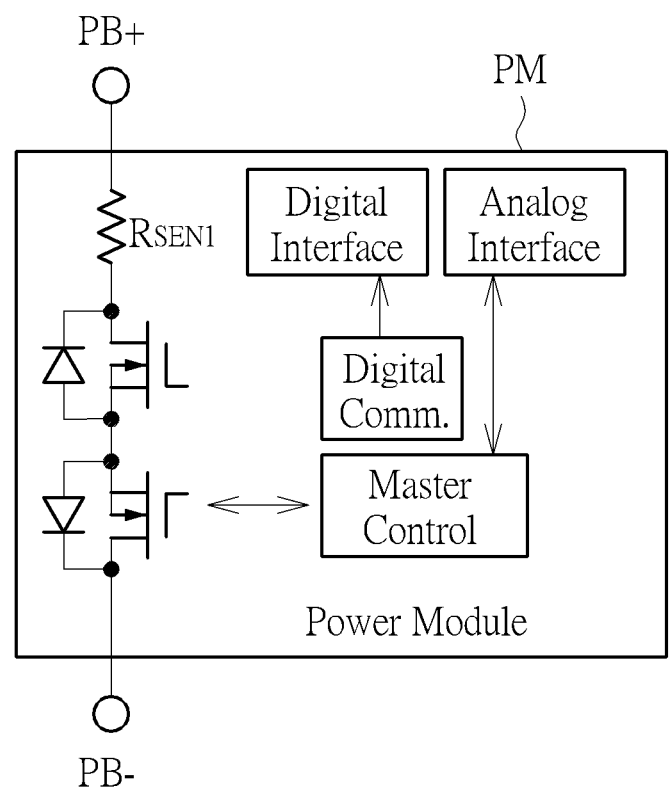
FIG. 2 is a diagram of an apparatus for controlling a power supply device according to a second embodiment of the present invention, where the apparatus of this embodiment comprises a power module.

FIG. 2 is a diagram of an apparatus for controlling a power supply device according to a second embodiment of the present invention, where the apparatus of this embodiment comprises a power module PM, which can be a portion of the power supply device, and the power module PM can also be referred to as the power block (PB). The power module PM may comprise a sensing resistor $R_{SEN1}$ arranged to detect the current of the battery cells within the power supply device, such as the current on a current path passing through the battery cells of all of the battery modules {BM} of the power supply device, and may further comprise a plurality of switches (e.g. two metal-oxide-semiconductor field-effect transistors (MOSFETs) in this embodiment) that are positioned on the current path of the battery cells within the power supply device, for selectively enable or disable the current path of the battery cells within the power supply device. For example, in a situation where the power supply device comprises multiple battery modules that are connected in series, the sensing resistor $R_{SEN1}$ can be utilized for detecting the current of the battery cells of these battery modules. In another example, in a situation where the power supply device comprises a single battery module, the sensing resistor $R_{SEN1}$ can be utilized for detecting the current of the battery cells of this battery module. In addition, the power module PM may comprise at least one processing circuit. For example, the aforementioned at least one processing circuit of the power module PM may comprise a digital communication control circuit (labeled "Digital Comm." in FIG. 2, for brevity) and a master control circuit (labeled "Master Control" in FIG. 2, for brevity). Additionally, the power module PM may comprise a digital interface and an analog interface, which are arranged to communicate with one or more other modules within the power supply device for the power module PM by using digital signals and analog signals, respectively.

According to this embodiment, the aforementioned at least one processing circuit is arranged to control operations of the power module PM. For example, the digital communication control circuit of the power module PM may perform digital communication control for the power module PM (more particularly, for the master control circuit of the power module PM). In another example, the master control circuit may control the switches such as the MOSFETs based on one or more analog signals received from the analog interface of the power module PM. This is for illustrative purposes only, and is not meant to be a limitation of the present invention. In another example, the master control circuit may control the switches such as the MOSFETs based on the current passing through the sensing resistor $R_{SEN1}$. In another example, the master control circuit may control one or more other modules (e.g. one or more battery modules {BM}) within the power supply device. In another example, the master control circuit may collect information from other modules (e.g. one or more battery modules {BM}) within the power supply device.

In practice, the power module PM may comprise a case arranged to protect components (e.g. the battery cells and the internal circuits) of the power module PM. For example, the external terminals PB+ and PB− of the partial circuit comprising both of the sensing resistor $R_{SEN1}$ and the MOSFETs within the power module PM can be positioned on the case of the power module PM, and can be implemented with one or more connectors installed on the case of the power module PM. This is for illustrative purposes only, and is not meant to be a limitation of the present invention. In another example, the external terminals PB+ and PB− can be implemented with one or more connectors and one or more cables extended from the case of the power module PM.

Figure 3:
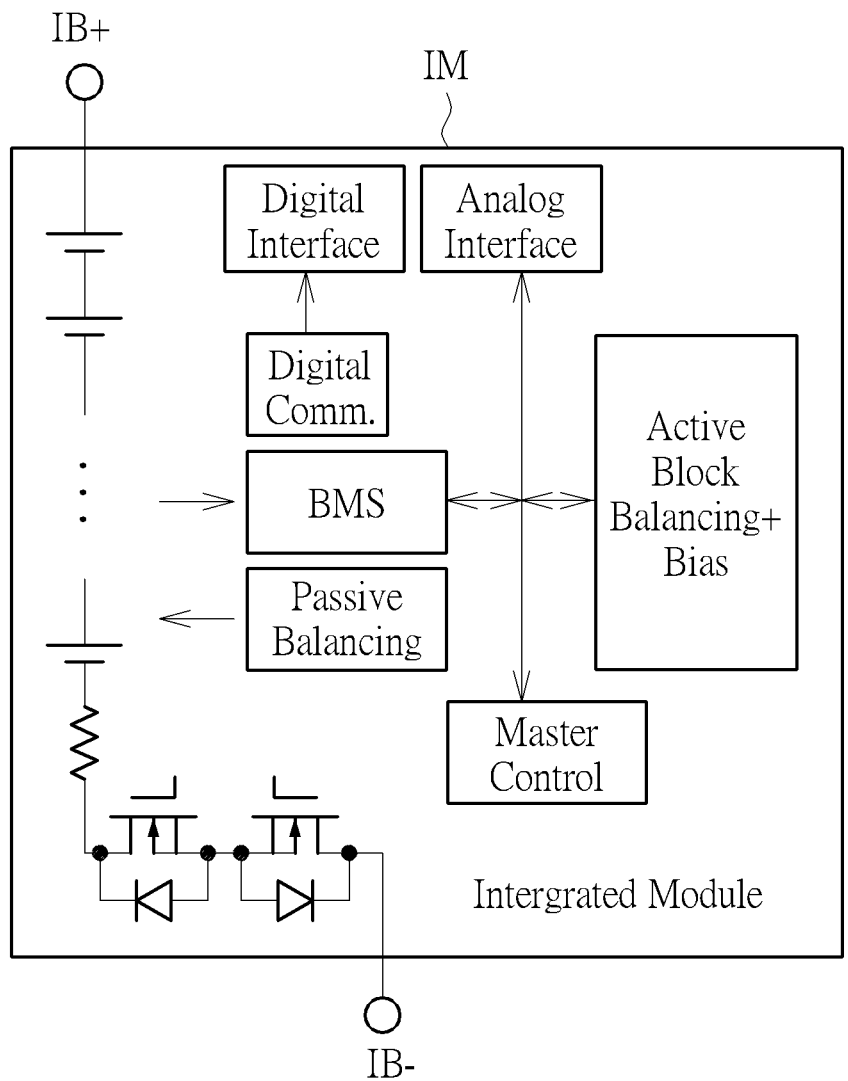
FIG. 3 is a diagram of an apparatus for controlling a power supply device according to a third embodiment of the present invention, where the apparatus of this embodiment comprises an integrated module.

FIG. 3 is a diagram of an apparatus for controlling a power supply device according to a third embodiment of the present invention, where the apparatus of this embodiment comprises an integrated module IM, which can be a portion of the power supply device, and the integrated module IM can also be referred to as the integrated block (IB). The integrated module IM can be implemented by integrating the battery module BM shown in FIG. 1 and the power module PM shown in FIG. 2 into the same module. For example, the integrated module IM may comprise all of the components of the battery module BM shown in FIG. 1 and all of the components of the power module PM shown in FIG. 2. This is for illustrative purposes only, and is not meant to be a limitation of the present invention. In some examples, the integrated module IM may comprise at least one portion (e.g. a portion or all) of the components of the battery module BM shown in FIG. 1 and at least one portion (e.g. a portion or all) of the components of the power module PM shown in FIG. 2, where some common components (e.g. the digital interface and the analog interface) may be shared. As the architecture of the embodiment shown in FIG. 3 can be varied from that of the embodiments shown in FIG. 1 and FIG. 2, the associated operations of the architecture of the embodiment shown in FIG. 3 can be similar to that of the embodiments shown in FIG. 1 and FIG. 2. Similar descriptions for this embodiment are not repeated in detail here.

In practice, the integrated module IM may comprise a case arranged to protect components (e.g. the battery cells and the internal circuits) of the integrated module IM. For example, the external terminals IB+ and IB− can be positioned on the case of the integrated module IM, and can be implemented with one or more connectors installed on the case of the integrated module IM. This is for illustrative purposes only, and is not meant to be a limitation of the present invention. In another example, the external terminals IB+ and IB− can be implemented with one or more connectors and one or more cables extended from the case of the integrated module IM.

Figure 4:
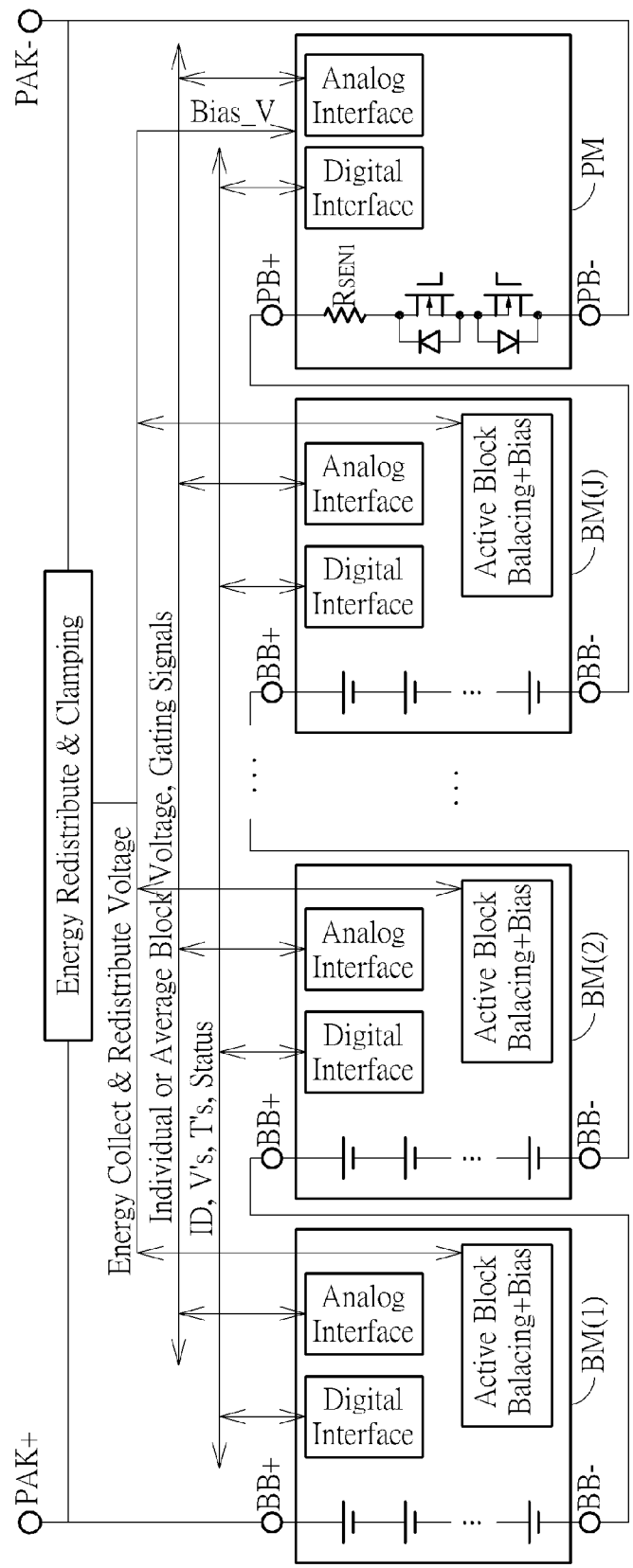
FIG. 4 is a diagram of an apparatus for controlling a power supply device according to a fourth embodiment of the present invention, where the apparatus of this embodiment comprises a set of battery modules and a power module.

FIG. 4 is a diagram of an apparatus for controlling a power supply device according to a fourth embodiment of the present invention, where the apparatus of this embodiment comprises a set of battery modules {BM} such as the battery modules {BM(1), BM(2), . . . , BM(J)}, each of which can be a copy of the battery module BM shown in FIG. 1, and further comprises a power module such as the power module PM shown in FIG. 2. For example, the notation J may represent a positive integer that is greater than one. This is for illustrative purposes only, and is not meant to be a limitation of the present invention. According to some variations of this embodiment, the notation J may represent a positive integer, which may be equal to or greater than one. In addition, the energy redistribution and clamping circuit (labeled "Energy Redistribute & Clamping" in FIG. 4, for brevity) can be taken as an example of the system control circuit mentioned above. As shown in FIG. 4, the set of battery modules {BM} such as the battery modules {BM(1), BM(2), . . . , BM(J)} (more particularly, the battery cells of the battery modules {BM(1), BM(2), . . . , BM(J)}) are connected in series, and the terminals PAK+ and PAK− can be regarded as the external terminal of the whole of the battery modules {BM(1), BM(2), . . . , BM(J)}.

According to this embodiment, under control of the aforementioned system control circuit such as the energy redistribution and clamping circuit shown in FIG. 4, the active balancing circuit of a specific battery module BM(j) (e.g. any of the battery modules {BM(1), BM(2), . . . , BM(J)}, where the index j may represent a positive integer that falls within the range of the interval [1, J]), such as the active block balancing and bias circuit in the specific battery module BM(j), is arranged to perform active balancing of the battery cells for the battery module BM. For example, under control of the system control circuit such as the energy redistribution and clamping circuit, the active balancing circuit such as the active block balancing and bias circuit in the specific battery module BM(j) may perform active balancing between the battery cells of the battery module BM and that of at least one other battery module (e.g. one or more other battery modules) within the power supply device, and more particularly, to dynamically collect energy from the specific battery module BM(j) in order to redistribute energy toward the aforementioned at least one other battery module or collect energy from the aforementioned at least one other battery module in order to redistribute energy toward the specific battery module BM(j). More particularly, the active block balancing and bias circuit of the specific battery module BM(j) such as any of the battery modules {BM(1), BM(2), ..., BM(J)} may provide the internal circuits of the power module PM with the bias voltage mentioned in the embodiment shown in FIG. 1, such as the bias voltage Bias_V shown in FIG. 4, where the power module PM shown in FIG. 4 may obtain electric power from the active block balancing and bias circuit in the specific battery module BM(j).

In addition, according to this embodiment, the analog signals transmitted or received between the analog interfaces of any two modules in the modules shown in FIG. 4 (e.g. the battery modules {BM(1), BM(2), ..., BM(J)} and the power module PM) may comprise one or more individual block voltages (e.g. the total voltage drop of the battery cells of one of the battery modules {BM(1), BM(2), ..., BM(J), such as that of the specific battery module BM(j)), one or more average block voltages (e.g. an average of the total voltage drops respectively corresponding to the battery modules {BM(1), BM(2), ..., BM(J), such as the average of the voltage differences between the terminals BB+ and BB− of the battery modules {BM(1), BM(2), ..., BM(J)}, and/or gating signals. For example, the aforementioned one or more individual block voltages can be generated by the BMS circuit in the specific battery module BM(j). In another example, the aforementioned one or more average block voltages can be generated by the master control circuit in the power module PM. In another example, the gating signals mentioned above can be generated by the master control circuit in the power module PM, where the gating signals can be utilized for controlling the battery modules {BM(1), BM(2), ..., BM(J)}.

As shown in FIG. 4, the digital signals transmitted or received between the digital interfaces of any two modules in the modules shown in FIG. 4 (e.g. the battery modules {BM(1), BM(2), ..., BM(J)} and the power module PM) may comprise one or more identifications (IDs) (e.g. the IDs of the battery modules {BM(1), BM(2), ..., BM(J) and the power module PM), one or more voltage values (labeled "V's" in FIG. 4, for brevity), one or more temperature values (labeled "T's" in FIG. 4, for brevity), and/or one or more statuses. For example, the aforementioned one or more IDs can be utilized for indicating the destinations of packets carried by the digital signals. In another example, the aforementioned one or more IDs can be utilized for indicating the sources of the associated information (or the sources that the associated information belongs to), such as the sources of the aforementioned one or more voltage values, the sources of the aforementioned one or more temperature values, and/or the sources of the aforementioned one or more statuses, where the digital signals may indicate the associated information of any of the modules shown in FIG. 4 (e.g. the battery modules {BM(1), BM(2), ..., BM(J)} and the power module PM), such as the voltage values, the temperature values, and the statuses of the module under consideration within the modules shown in FIG. 4.

According to this embodiment, the power supply device can be implemented and configured with ease. As each of the functional blocks (e.g. any of the battery modules {BM}, and the power module PM) is a full-featured modularized functional block, the goal of easy system configuration can be achieved, where related costs can be saved. As the active block balancing and bias circuits are built-in in the battery modules {BM(1), BM(2), ..., BM(J)}, there is no need to redesign the functional blocks when the power supply device is configured to be different systems (e.g. the number J of the battery modules {BM(1), BM(2), ..., BM(J)} is changed) for different requirements, respectively.

Figure 5:
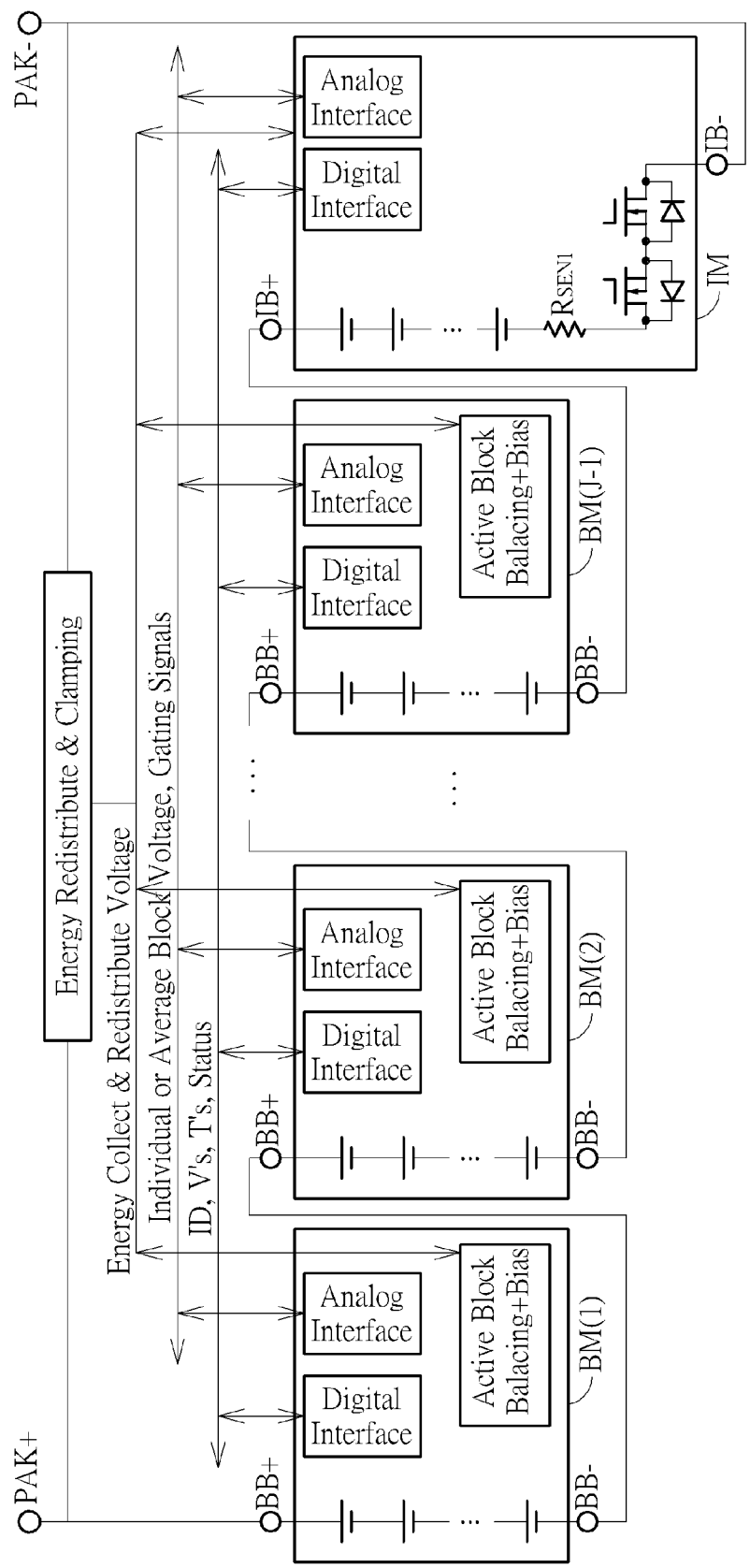
FIG. 5 is a diagram of an apparatus for controlling a power supply device according to a fifth embodiment of the present invention, where the apparatus of this embodiment comprises a set of battery modules and an integrated module.

FIG. 5 is a diagram of an apparatus for controlling a power supply device according to a fifth embodiment of the present invention, where the apparatus of this embodiment comprises a set of battery modules {BM} such as the battery modules {BM(1), BM(2), ..., BM(J−1)}, each of which can be a copy of the battery module BM shown in FIG. 1, and further comprises an integrated module such as the integrated module IM shown in FIG. 3. Similarly, the energy redistribution and clamping circuit (labeled "Energy Redistribute & Clamping" in FIG. 5, for brevity) can be taken as an example of the system control circuit mentioned above. As shown in FIG. 5, the set of battery modules {BM} such as the battery modules {BM(1), BM(2), ..., BM(J−1)} and the integrated module IM (more particularly, the battery cells of the battery modules {BM(1), BM(2), ..., BM(J−1)} and the integrated module IM) are connected in series, and the terminals PAK+ and PAK− can be regarded as the external terminal of the whole of the battery modules {BM(1), BM(2), ..., BM(J−1)} and the integrated module IM. As the integrated module IM shown in FIG. 5 can be implemented by integrating the battery module BM(J) shown in FIG. 4 and the power module PM shown in FIG. 4 into the same module, the architecture of this embodiment can be varied from that of the embodiment shown in FIG. 4, and the associated operations of the architecture of this embodiment can be similar to that of the embodiment shown in FIG. 4. Similar descriptions for this embodiment are not repeated in detail here.

According to this embodiment, the power supply device can be implemented and configured with ease. As each of the functional blocks (e.g. any of the battery modules {BM}, and the integrated module IM) is a full-featured modularized functional block, the goal of easy system configuration can be achieved, where related costs can be saved. As the active block balancing and bias circuits are built-in in the battery modules {BM(1), BM(2), ..., BM(J)} and the integrated module IM, there is no need to redesign the functional blocks when the power supply device is configured to be different systems (e.g. the number (J−1) of the battery modules {BM(1), BM(2), ..., BM(J−1)} is changed) for different requirements, respectively.

Figure 6:
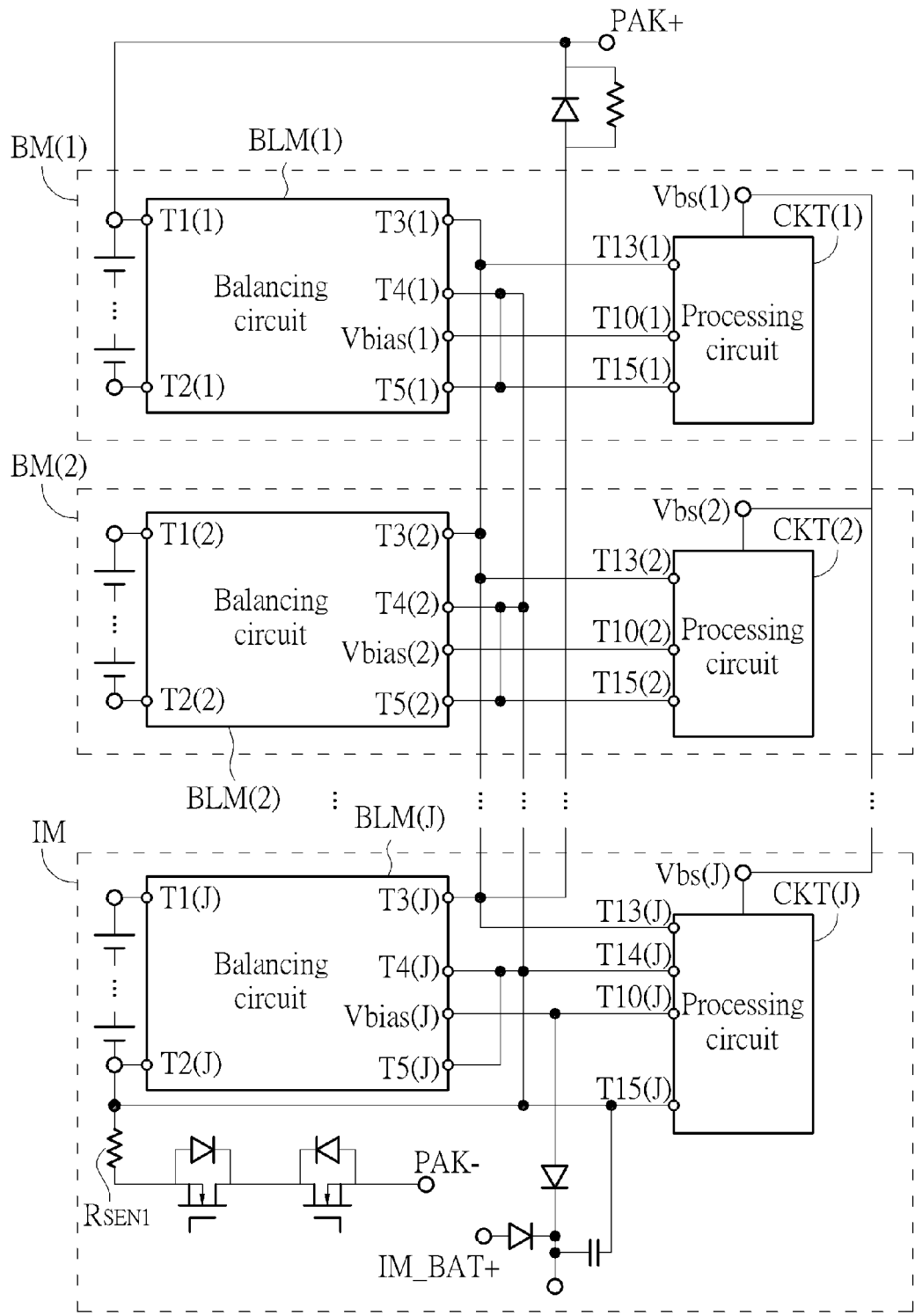
FIG. 6 is a diagram of an apparatus for controlling a power supply device according to an embodiment of the present invention.

FIG. 6 is a diagram of an apparatus for controlling a power supply device according to an embodiment of the present invention. The balancing circuits {BLM(1), BLM(2), ..., BLM(J)} can be taken as examples of the aforementioned at least one balancing circuit, and more particularly, can be taken as examples of the aforementioned active block balancing and bias circuit of the battery module BM shown in FIG. 1. Thus, the balancing circuits {BLM(1), BLM(2), ..., BLM(J)} can be regarded as the active block balancing and bias circuits of the battery modules {BM(1), BM(2), ..., BM(J)} in the embodiment shown in FIG. 4, respectively, or the active block balancing and bias circuits of the battery modules {BM(1), BM(2), ..., BM(J−1)} and the integrated module IM in the embodiment shown in FIG. 5, respectively.

In addition, the processing circuits {CKT(1), CKT(2), ..., CKT(J)} can be taken as examples of the aforementioned at least one processing circuit of the battery module BM shown in FIG. 1. For example, the processing circuit CKT(j) can be implemented within the BMS circuit of the battery module BM(j). This is for illustrative purposes only, and is not meant to be a limitation of the present invention. According to some variations of this embodiment, the architecture of the processing circuit CKT(j) can be varied. For example, the processing circuit CKT(j) can be implemented within another portion of the battery module BM(j). In another example, the processing circuit CKT(j) may comprise at least one portion (e.g. a portion or all) of the aforementioned at least one processing circuit of the battery module BM(j).

As shown in FIG. 6, the terminals {T1(1), T2(1)}, {T1(2), T2(2)}, ..., and {T1(J), T2(J)} of the balancing circuits BLM(1), BLM(2), ..., and BLM(J) are electrically connected to the corresponding sets of battery cells in the battery modules BM(1), BM(2), etc. and the integrated module IM shown in FIG. 6, respectively, and can be regarded as internal terminals of the battery modules BM(1), BM(2), etc. and the integrated module IM shown in FIG. 6, respectively. The terminals {T3(1), T4(1), T5(1)}, {T3(2), T4(2), T5(2)}, ..., and {T3(J), T4(J), T5(J)} of the balancing circuits BLM(1), BLM(2), ..., and BLM(J) can be implemented in the analog interfaces of the battery modules BM(1), BM(2), etc. and the integrated module IM shown in FIG. 6, respectively, and can be regarded as external terminals of the battery modules BM(1), BM(2), etc. and the integrated module IM shown in FIG. 6, respectively, where the terminals T3(1), T3(2), ..., and T3(J) are electrically connected to each other, and the terminals {T4(1), T5(1)}, {T4(2), T5(2)}, ..., and {T4(J), T5(J)} are electrically connected to each other. In addition, the terminals {T10(1), T13(1), T15(1)}, {T10(2), T13(2), T15(2)}, ..., and {T10(J), T13(J), T15(J)} of the processing circuits CKT(1), CKT(2), ..., and CKT(J) are electrically connected to the terminals {Vbias(1), T3(1), T5(1)}, {Vbias(2), T3(2), T5(2)}, ..., and {Vbias(J), T3(J), T5(J)} of the balancing circuits BLM(1), BLM(2), ..., and BLM(J), where the terminal T14(J) of the processing circuit CKT(J) is electrically connected to the terminal T4(J) of the balancing circuit BLM(J). As the balancing circuits BLM(1), BLM(2), ..., and BLM(J) may provide the processing circuits CKT(1), CKT(2), ..., and CKT(J) with electric power through the terminals Vbias(1), Vbias(2), ..., and Vbias(J), respectively, the terminals Vbias(1), Vbias(2), ..., and Vbias(J) can be regarded as the local power terminals for the processing circuits CKT(1), CKT(2), ..., and CKT(J), respectively. Thus, the terminals T10(1), T10(2), ..., and T10(J), which are electrically connected to the terminals Vbias(1), Vbias(2), ..., and Vbias(J), respectively, can be regarded as the local power input terminals of the processing circuits CKT(1), CKT(2), ..., and CKT(J), respectively, and the terminal T14(J) can be regarded as the local ground of the processing circuit CKT(J). Please note that the terminals Vbs(1), Vbs(2), ..., and Vbs(J) of the processing circuits CKT(1), CKT(2), ..., and CKT(J) are electrically connected to each other. Additionally, for example, the bottommost terminal shown in FIG. 6 can be utilized for outputting the bias voltage for the system control circuit mentioned above (e.g. the system control circuit of the whole system), and the terminal IM_BAT+ can be electrically connected to a certain terminal of the processing circuit CKT(J).

Figure 7:
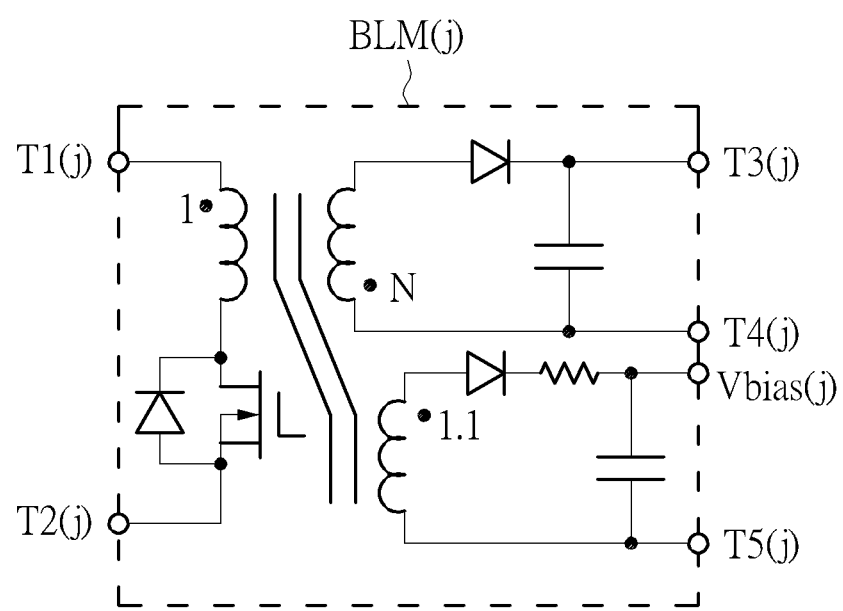
FIG. 7 illustrates some implementation details of one of the balancing circuits shown in FIG. 6 according to an embodiment of the present invention.

FIG. 7 illustrates some implementation details of one of the balancing circuits {BLM(1), BLM(2), ..., BLM(J)} shown in FIG. 6, such as the balancing circuit BLM(j), according to an embodiment of the present invention. The connections regarding the terminals {T1(j), T2(j), T3(j), T4(j), T5(j), Vbias(j)} in any of the battery module BM(1), BM(2), etc. and the integrated module IM shown in FIG. 6 can be the same as that described in the embodiment shown in FIG. 6.

According to this embodiment, the balancing circuit BLM(j) may comprise a plurality of windings which correspond to a primary side and a secondary side, respectively, such as the winding labeled "1" thereon, the winding labeled "N" thereon, and the winding labeled "1.1" thereon. More particularly, the winding labeled "1" corresponds to the primary side, and any of the winding labeled "N" or the winding labeled "1.1" corresponds to the secondary side. For example, for a first transformer formed with the winding labeled "1" thereon and the winding labeled "N" thereon, the turn ratio of the secondary side to the primary side (i.e. the turn ratio of the winding labeled "N" to the winding labeled "1") may equal N:1, where the first transformer can be utilized for performing active balancing for the corresponding module (e.g. any of the battery module BM(1), BM(2), etc. and the integrated module IM shown in FIG. 6). In another example, for a second transformer formed with the winding labeled "1" thereon and the winding labeled "1.1" thereon, the turn ratio of the secondary side to the primary side (i.e. the turn ratio of the winding labeled "1.1" to the winding labeled "1") may equal 1.1:1, where the second transformer can be utilized for generating bias for the internal circuit of the corresponding module (e.g. any of the battery module BM(1), BM(2), etc. and the integrated module IM shown in FIG. 6), and more particularly, for generating the bias voltage for the aforementioned at least one processing circuit of the corresponding module mentioned above.

Based on the architecture shown in FIG. 7, the bias energy can be derived from battery blocks (more particularly, the battery cells in any of the battery module BM(1), BM(2), etc. and the integrated module IM shown in FIG. 6) with higher energy contents which are to be redistributed (or taken away) during battery block action. In addition, in a situation where j=J in the architecture shown in FIG. 7, the bias energy can also be delivered from the battery cells in the integrated module IM shown in FIG. 6 when no battery block is in action. This is for illustrative purposes only, and is not meant to be a limitation of the present invention. According to some variations of this embodiment, in systems such as those corresponding to the architecture shown in FIG. 4, the bias can be generated similarly with the battery module BM(J−1) adjacent to the power module PM playing the role of the integrated module IM, where the bias energy is then routed to the power module PM.

Figure 8:
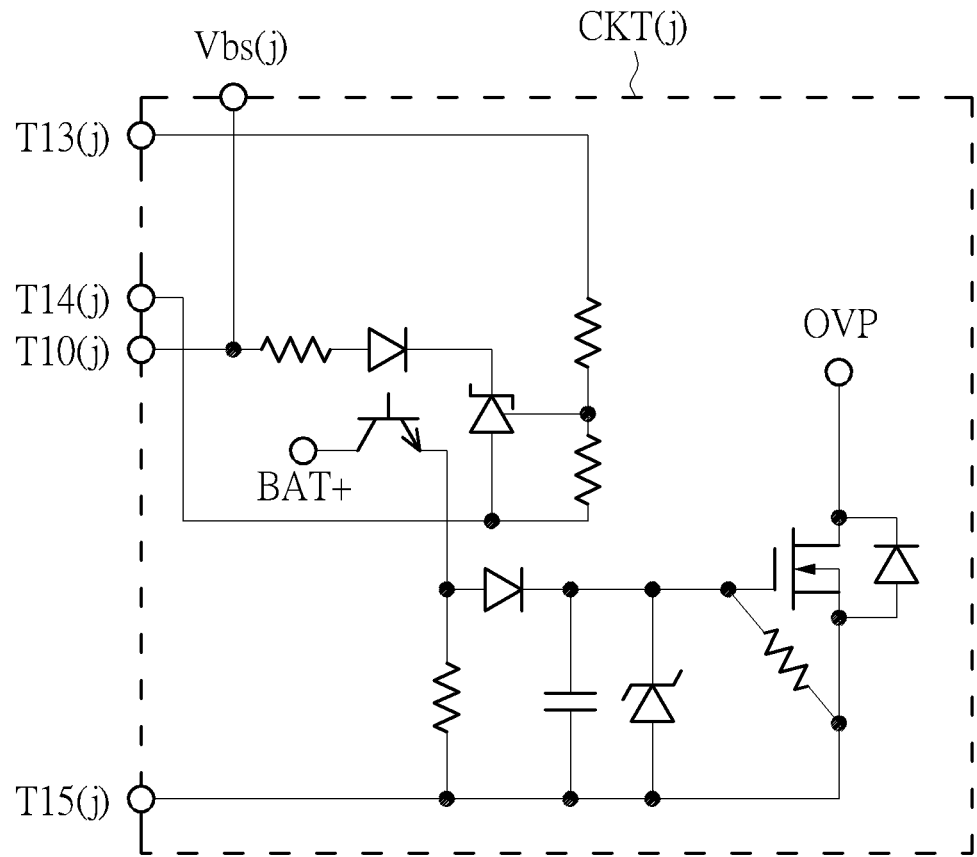
FIG. 8 illustrates some implementation details of one of the processing circuits shown in FIG. 6 according to an embodiment of the present invention.

FIG. 8 illustrates some implementation details of one of the processing circuits {CKT(1), CKT(2), ..., CKT(J)} shown in FIG. 6, such as the processing circuit CKT(j), according to an embodiment of the present invention. The connections regarding the terminals {T10(j), T13(j), T14(j), T15(j), Vbs(j)} in any of the battery module BM(1), BM(2), etc. and the integrated module IM shown in FIG. 6 can be the same as that described in the embodiment shown in FIG. 6.

According to this embodiment, the processing circuit CKT(j) may comprise a plurality of resistors, a plurality of diodes, and a plurality of switches (e.g. MOSFETs in this embodiment). For example, in a situation where j=J in the architecture shown in FIG. 8, the terminal IM_BAT+ shown in FIG. 6 can be electrically connected to the terminal BAT+ of the processing circuit CKT(J). In another example, the terminal OVP of the processing circuit CKT(j) can be utilized for some control purposes.

Figure 9:
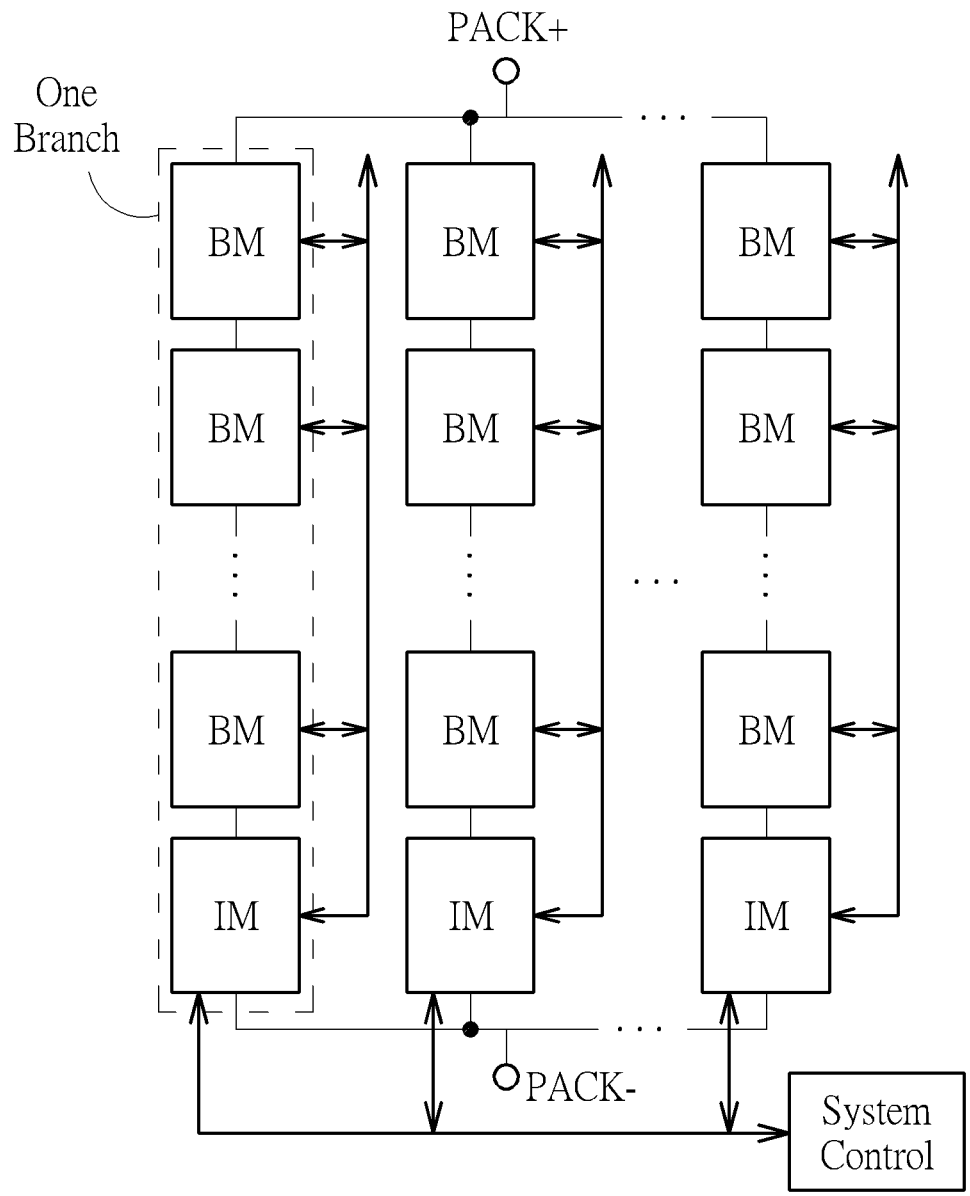
FIG. 9 is a diagram of an apparatus for controlling a power supply device according to an embodiment of the present invention, where the apparatus of this embodiment comprises multiple branches, each of which comprises a set of battery modules and an integrated module.

FIG. 9 is a diagram of an apparatus for controlling a power supply device according to an embodiment of the present invention, where the apparatus of this embodiment comprises multiple branches, each of which comprises a set of battery modules and an integrated module, such as the battery modules {BM(1), BM(2), . . . , BM(J-1)} and the integrated module IM shown in FIG. 5. As shown in FIG. 9, the branches are electrically connected to the external terminals PACK+ and PACK− of the whole system in parallel, where the terminals PAK+ and PAK− of each of the branches are electrically connected to the external terminals PACK+ and PACK− of the whole system, respectively. In addition, the system control circuit mentioned above (labeled "System Control" in FIG. 9, for brevity) may control operations of each of the branches. For example, the architecture shown in FIG. 9 can be utilized in a situation where the whole system is a system of low-medium voltage (e.g. the output voltage is less than or equal to 154 Volts (V)) and low branch current (e.g. the output current is less than or equal to 80 Ampere (A)). This is for illustrative purposes only, and is not meant to be a limitation of the present invention.

Figure 10:
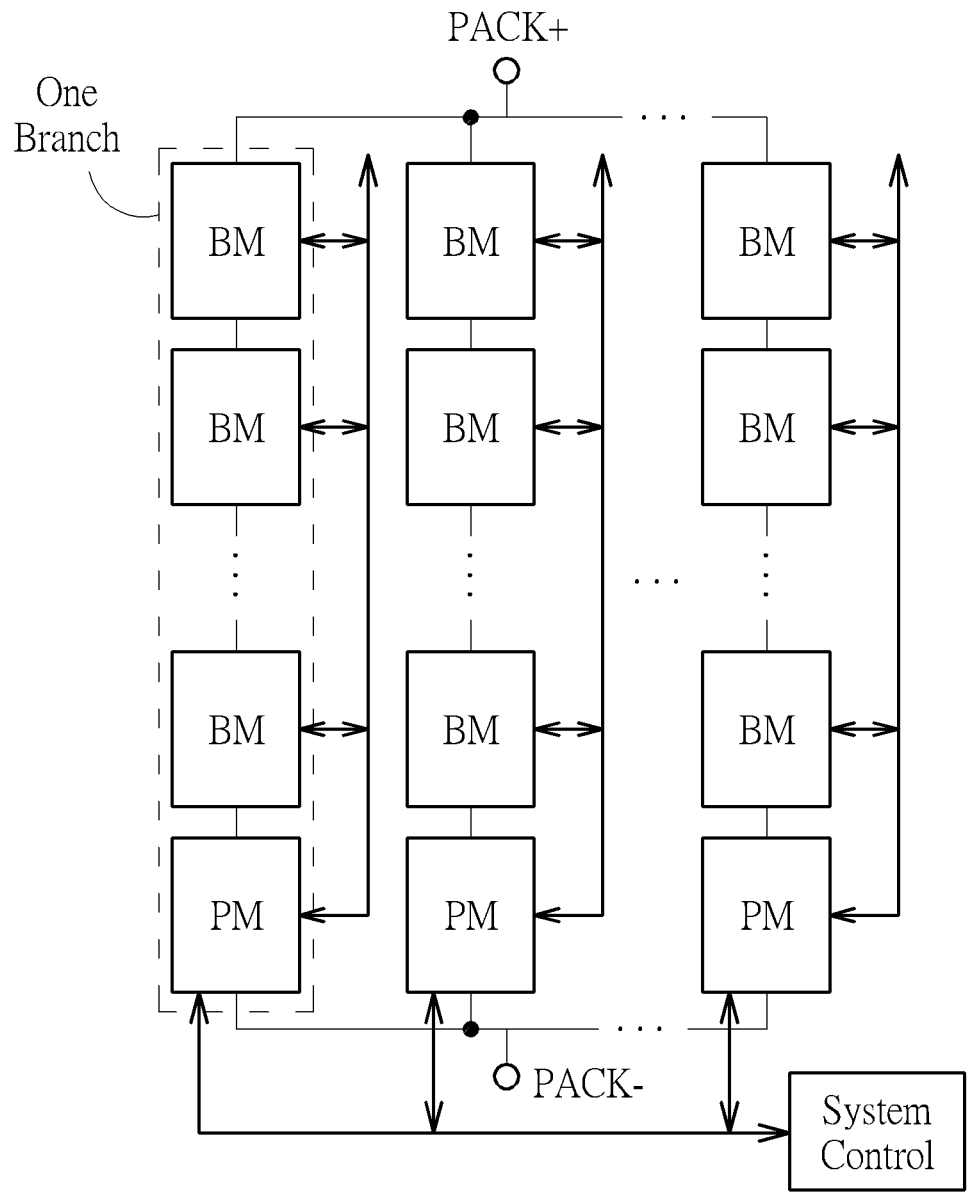
FIG. 10 is a diagram of an apparatus for controlling a power supply device according to another embodiment of the present invention, where the apparatus of this embodiment comprises multiple branches, each of which comprises a set of battery modules and a power module.

FIG. 10 is a diagram of an apparatus for controlling a power supply device according to another embodiment of the present invention, where the apparatus of this embodiment comprises multiple branches, each of which comprises a set of battery modules and a power module, such as the battery modules {BM(1), BM(2), . . . , BM(J)} and the power module PM shown in FIG. 4. As shown in FIG. 10, the branches are electrically connected to the external terminals PACK+ and PACK− of the whole system in parallel, where the terminals PAK+ and PAK− of each of the branches are electrically connected to the external terminals PACK+ and PACK− of the whole system, respectively. In addition, the system control circuit mentioned above (labeled "System Control" in FIG. 10, for brevity) may control operations of each of the branches. For example, the architecture shown in FIG. 10 can be utilized in a situation where the whole system is a system of high voltage (e.g. the output voltage is greater than 154 V, and is less than or equal to 450 V) and low branch current (e.g. the output current is greater than or equal to 120 A). This is for illustrative purposes only, and is not meant to be a limitation of the present invention.

Based on the embodiments described above, the present invention further provides a method for controlling a power supply device such as that mentioned above, where the method comprises: utilizing the aforementioned at least one balancing circuit of the specific battery module BM(j) of the set of battery modules {PM} connected in series within the power supply device (e.g. the battery modules {BM(1), BM(2), . . . , BM(J)}) to perform balancing of the aforementioned at least one battery cell of the specific battery module BM(j); and utilizing the aforementioned at least one balancing circuit to provide the aforementioned at least one processing circuit of the specific battery module BM(j) with the corresponding bias voltage, where the aforementioned at least one processing circuit obtains electric power from the aforementioned at least one balancing circuit, and is arranged to control operations of the specific battery module BM(j). As the associated operations regarding this method are disclosed in the embodiments described above, similar descriptions for this method are not repeated in detail here.

In addition, according to some embodiments of the present invention, the balancing circuit of a battery module such as that mentioned above (e.g. the battery module BM) is used for collecting energy from one or more other battery modules within the power supply device to provide the power module with energy obtained from a battery module having the most energy in all battery modules within the power supply device. In some embodiments of the present invention, the power module and a battery module such as that mentioned above (e.g. the battery module BM) can be integrated into the same module, which can be referred to as an integrated module. For example, the integrated module is electrically connected to the set of battery modules connected in series within the power supply device. More particularly, when energy of at least one battery cell of the integrated module is greater than a predetermined value, the at least one battery cell of the integrated module provides the balancing circuit of the integrated module and the processing circuit of the integrated module with energy. When energy of the at least one battery cell of the integrated module is less than another predetermined value, a battery module having the most energy in all battery modules within the power supply device provides the processing circuit of the integrated module with energy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for controlling a power supply device, the apparatus comprising at least one portion of the power supply device, the apparatus comprising:
   at least one battery module, each of which is a battery module of a set of battery modules connected in series within the power supply device, wherein each battery module of the set of battery modules comprises:
   at least one battery cell;
   a processing circuit arranged to control operations of said each battery module of the set of battery modules; and
   a balancing circuit, electrically connected to the at least one battery cell and the processing circuit, wherein under control of the processing circuit, the balancing circuit performs balancing of the at least one battery cell;
   wherein the balancing circuit provides the processing circuit with a bias voltage, and the processing circuit obtains electric power from the balancing circuit.

2. The apparatus of claim 1, wherein said each battery module of the set of battery modules further comprises:
   an analog interface, arranged to communicate with one or more other modules within the power supply device for said each battery module of the set of battery modules by using analog signals.

3. The apparatus of claim 2, wherein the balancing circuit comprises:
   an active balancing circuit, electrically connected to the analog interface and the at least one battery cell, arranged to perform active balancing of the at least one battery cell.

4. The apparatus of claim 3, wherein under control of a system control circuit of the power supply device, the active balancing circuit performs active balancing between the at least one battery cell and that of at least one other module within the power supply device.

5. The apparatus of claim 4, wherein under control of the system control circuit of the power supply device, the active balancing circuit dynamically collects energy from the at least one battery cell in order to redistribute energy toward the at least one other module or collects energy from the at least one other module in order to redistribute energy toward the at least one battery cell.

6. The apparatus of claim 3, wherein the active balancing circuit is an active block balancing and bias circuit, and comprises:

a plurality of windings which correspond to a primary side and a secondary side, respectively;

wherein a first transformer is formed with a first winding and a second winding within the plurality of windings, wherein the first transformer is utilized for performing active balancing for the specific battery module;

a second transformer is formed with the first winding and a third winding within the plurality of windings, wherein the second transformer is utilized for generating the bias voltage; and the active block balancing and bias circuit provides the processing circuit with the bias voltage, wherein the processing circuit obtains electric power from the active block balancing and bias circuit.

7. The apparatus of claim 1, further comprising:

a power module, which is electrically connected to the set of battery modules in series within the power supply device, wherein the power module comprises:

an analog interface, arranged to communicate with one or more other modules within the power supply device for the power module by using analog signals; and a master control circuit arranged to control a plurality of switches based on one or more analog signals received from the analog interface of the power module, wherein the plurality of switches is positioned on a current path passing through the battery cells of all of the battery modules of the power supply device.

8. The apparatus of claim 7, wherein the balancing circuit of the battery module is used for collecting energy from one or more other battery modules within the power supply device to provide the power module with energy obtained from a battery module having most energy in all battery modules within the power supply device.

9. The apparatus of claim 7, wherein the power module and the battery module are integrated into a same module, which is an integrated module.

10. The apparatus of claim 9, wherein the integrated module is electrically connected to the set of battery modules connected in series within the power supply device.

11. The apparatus of claim 10, wherein when energy of at least one battery cell of the integrated module is greater than a predetermined value, the at least one battery cell of the integrated module provides the balancing circuit of the integrated module and the processing circuit of the integrated module with energy; and when energy of the at least one battery cell of the integrated module is less than another predetermined value, a battery module having most energy in all battery modules within the power supply device provides the processing circuit of the integrated module with energy.

12. The apparatus of claim 7, wherein said each battery module of the set of battery modules further comprises an analog interface; and the analog signals transmitted or received between the analog interfaces comprise a total voltage drop of the at least one battery cells of one of the set of battery modules, an average of total voltage drops respectively corresponding to the set of battery modules, and gating signals generated by the master control circuit.

13. A method for controlling a power supply device, the method comprising:

utilizing a balancing circuit of a specific battery module of a set of battery modules connected in series within the power supply device to perform balancing of at least one battery cell of the specific battery module; and utilizing the balancing circuit to provide a processing circuit of the specific battery module with a bias voltage, wherein the processing circuit obtains electric power from the balancing circuit, and is arranged to control operations of the specific battery module.

14. The method of claim 13, wherein the balancing circuit comprises an active balancing circuit; and the method further comprises:

utilizing the active balancing circuit to perform active balancing of the at least one battery cell.

15. The method of claim 14, wherein under control of a system control circuit of the power supply device, the active balancing circuit performs active balancing between the at least one battery cell and that of at least one other module within the power supply device.

16. The method of claim 15, wherein under control of the system control circuit of the power supply device, the active balancing circuit dynamically collects energy from the at least one battery cell in order to redistribute energy toward the at least one other module or collects energy from the at least one other module in order to redistribute energy toward the at least one battery cell.

17. The method of claim 13, further comprising:

utilizing an analog interface of a power module to communicate with one or more other modules within the power supply device for the power module by using analog signals, wherein the power module is electrically connected to the set of battery modules in series within the power supply device; and utilizing a master control circuit of the power module to control a plurality of switches based on one or more analog signals received from the analog interface of the power module, wherein the plurality of switches is positioned on a current path passing through the battery cells of all of the battery modules of the power supply device.

18. The method of claim 17, wherein the power module and the specific battery module are integrated into a same module, which is an integrated module.

19. The method of claim 18, wherein the integrated module is electrically connected to the set of battery modules connected in series within the power supply device.

20. The method of claim 17, wherein the specific battery module further comprises an analog interface; and the analog signals transmitted or received between the analog interfaces comprise a total voltage drop of the at least one battery cells of the specific battery modules, an average of total voltage drops respectively corresponding to the set of battery modules, and gating signals generated by the master control circuit.

* * * * *